United States Patent [19]

Hanke et al.

[11] 4,407,858
[45] Oct. 4, 1983

[54] METHOD FOR PRODUCING FILMS OF SINTERED POLYCRYSTALLINE SILICON

[75] Inventors: Leopold Hanke, Beyharting, Austria; Hans Hellebrand, Munich; Helmut Schmelz, Prien, both of Fed. Rep. of Germany

[73] Assignee: Siemens Aktiengesellschaft, Berlin & Munich, Fed. Rep. of Germany

[21] Appl. No.: 335,587

[22] Filed: Dec. 29, 1981

[30] Foreign Application Priority Data

Jan. 13, 1981 [DE] Fed. Rep. of Germany ....... 3100776

[51] Int. Cl.³ .......................................... H01L 31/18
[52] U.S. Cl. ..................................... 427/86; 156/603; 264/63; 427/74
[58] Field of Search ...................... 427/74, 86; 264/63; 156/603

[56] References Cited

U.S. PATENT DOCUMENTS 2,904,613 9/1959 Paradise .............................. 156/648
4,173,494 11/1979 Kilby ................................... 427/74
4,330,358 5/1982 Grabmaier .......................... 427/74

OTHER PUBLICATIONS

Greskovich et al., "Sintering of Covalent Solids", Journal of American Ceramic Society, vol. 59, No. 7-8, pp. 336-343.

Primary Examiner—John D. Smith
Attorney, Agent, or Firm—Hill, Van Santen, Steadman & Simpson

[57] ABSTRACT

A low porosity sintered polycrystalline silicon film is produced by grinding initial silicon material in a non-oxygen-containing liquid, such as decahydronaphthalene, to an average grain size corresponding to a specific surface of at least 50 m²/g; thickening the so-attained grinding mass with a non-oxygen-containing material, such as polyisobutylene and/or polyethylene in a suitable solvent, so as to attain a viscosity in the resultant slip suitable for drawing a film from such slip, and drawing a film from such slip, optionally dividing the film into desired sized pieces, and sintering the resultant film or pieces.

5 Claims, 1 Drawing Figure

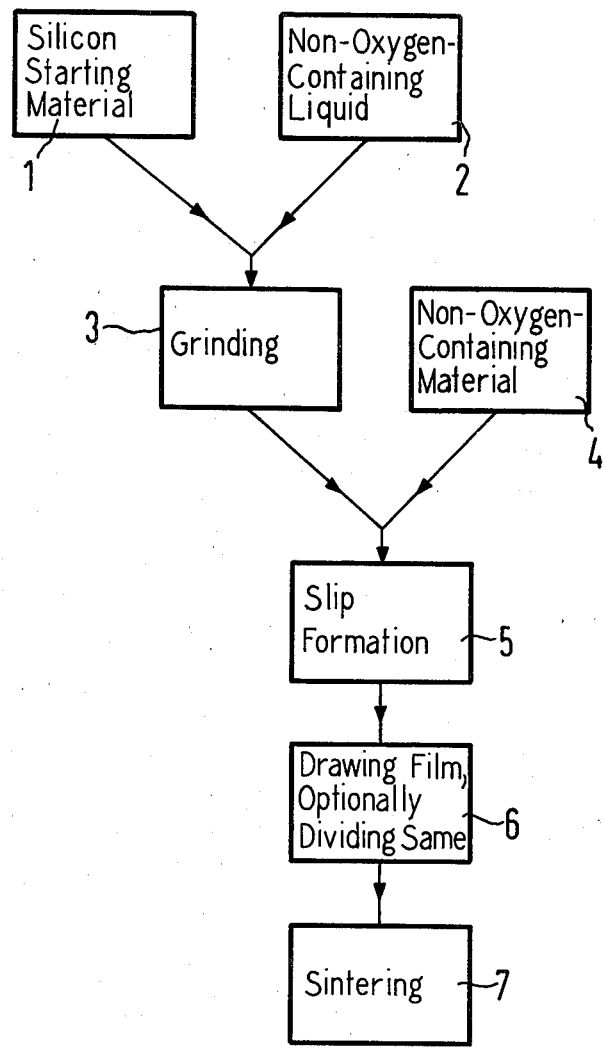

METHOD FOR PRODUCING FILMS OF SINTERED POLYCRYSTALLINE SILICON

BACKGROUND OF THE INVENTION

1. Field of the Invention

The invention relates to sintered polycrystalline silicon films and somewhat more particularly to the method of producing such films by extruding a slurry or slip of fine silicon particles admixed with suitable additives into a film and sintering such film.

2. Prior Art

Copending and commonly assigned patent applications Ser. No. 160,214, filed June 17, 1980 now U.S. Pat. No. 4,330,358; Ser. No. 261,780, filed May 8, 1981 now U.S. Pat. No. 4,357,200 and Ser. No. 261,921 now U.S. Pat. No. 4,357,201, filed May 8, 1981 disclose and claim details relative to methods for producing plate-shaped or tape-shaped silicon crystal bodies which have a crystalline pillar structure equivalent to a crystalline calumnar structure and which are suitable for fabrication into solar cells. These silicon bodies are produced by sintering a silicon powder starting material whereby such bodies are drawn-out or extruded from a silicon slip (i.e., a slurry of powder-form silicon and a suitable binder) with a suitable extrusion means onto a base as a film and such film is then sintered at a temperature below the melting point of silicon or at a temperature which only briefly attains the melting point of silicon (i.e., generally in the range of about 1350° to 1430° C.). The above-referenced Ser. No. 160,214 particularly provides many details concerning this method of producing polycrystalline silicon films by means of drawing and sintering so that a further discussion of details which are known per se is not necessary for a description of the present invention.

Within a framework of experiments aimed at attaining improvements to the state of development already known, as described, for example, in the above-referenced patent applications, it was determined that it was not sufficient for optimum results in the production of sintered polycrystalline films to merely transfer techniques which are obtained from years-long practice in producing sintered ceramic films and which have become a set part of production steps in manufacture of sintered films.

In instances of working with a slip of silicon, which is a covalently bound element, during the course of a sintering process, the appearance of a significant grain growth can already be noted at a point of time which is before the beginning of shrinkage of the slip or body formed from such slip. As has been determined, a too early occurance of grain growth hinders a further shrinkage of material so that, as result, a sintered silicon film arises which has a relatively high degree of open porosity.

The foregoing disadvantage was, however, solved to a certain degree whereby one undertook an at least partial melting of the silicon material during the actual sintering process. A disadvantage of this solution is that a relatively complicated method for exact temperature monitoring during the time interval of the melting aimed-for is required. Further, the kiln furniture, such as support members, composed of, for example, aluminum oxide or silicon dioxide, are greatly stressed by sintering/melting temperatures.

For quite a while, generally in order to attain densely sintered materials, sintering under pressure was utilized. However, this required significant additional technological outlay and could hardly be considered for inexpensive goods, such as materials for solar cells.

SUMMARY OF THE INVENTION

The invention provides a method of producing relatively impermeable densely sintered polycrystalline silicon films whereby only such additional technical outlay are required which do not make the method excessively expensive.

In accordance with the principles of the invention, silicon particles are ground or milled in a non-oxygen-containing liquid, such as decahydronaphthalene, to a particle size corresponding to a specific surface of at least $50m^2/g$ and the resultant fine particle material is thickened directly with a further non-oxygen-containing material, such as a 10% solution of polyisobutylene, up to a viscosity adapted for drawing or extrusion of the resultant slip into a film and thereafter, a drawing or extrusion of the film and sintering thereof are carried out in a manner known per se.

Tedious experiments and investigations seeking to overcome the prior art drawbacks mentioned above led again and again to significant additional technological outlays. The foregoing also applies to a technique which as borrowed from a concept that was disclosed years ago within a framework of producing sintered hard metal tools. For production of sintered materials from silicon carbide, silicon nitride, silicon and like materials, an article in the *Journal of American Ceramic Society*, Vol. 59 (1976) pages 336 et seq suggests that sintering additives, such as boron, are useful and that sintering of pure silicon is dependent upon use of a particle size in the submicron range, for example by using a powder grain size of about $0.06\mu m$. As far as is apparent in connection with this proposal, one intentionally allowed a surface oxidation of the generated silicon powder grains to occur. In this regard, it must be remembered that finely ground silicon powder is in itself highly explosive. However, this problem can be eliminated by constantly allowing surface oxidation of the small silicon particles momentarily arising, to occur. These techniques known in total from the field of manufacture of hard metal tools, are however, not transferable to the manufacturer of solar cells because in solar cells, materials must be present in the sintered body as silicon in a form which only very slightly oxidized; in other words, any significant amount of silicon dioxide in a solar body is disruptive because it significantly reduces the efficiency of the solar cell. On the other hand, it is true that the threatening danger of explosion requires significant additional technical outlay.

The principles of the invention, despite the above stated reservations and disadvantages, allow the attainment of high density sintered silicon films with fine milling of silicon particles whereby entirely novel measures are utilized to avoid the danger of explosion and which bring with them advantages and savings in further processing steps. If, therefore, in the practice of the invention, one must accept additional technological outlays, these are such that they are, at least to a great extent, again eliminated by means of simplifications and facilitations during further process steps of the overall method so that, in total, competitive process is provided which permits the attainment of improved solar cells.

In accordance with the principles of the invention, grinding or milling of silicon occurs in a relatively inert, non-oxygen-containing liquid in a ball triturotor or the like, contrary to the customary practice of such wet grinding. Immediately or directly after grinding, the ground silicon particles, along with the grinding liquid, are admixed with a suitable amount of a further relatively inert, non-oxygen-containing or oxygen-free material until the viscosity of the resulting slurry or slip increases sufficiently for film drawing or extrusion, which degree of viscosity is known per se. In other words, the materials to be ground and the grinding liquid are thickened by this additional oxygen-free material to a sufficient extent for extrusion or drawing a film from the resultant slurry or slip. Thereafter, the extrusion and sintering of the film occurs in a manner known per se.

A non-oxygen-containing liquid, that is a liquid which in its chemical composition contains no oxygen and which to a large extent has no oxygen dissolved therein (and which is also relatively inert to silicon) is, for example, decahyronaphthalene, which is commercially available under the tradename Dekalin. With such oxygen-free liquid, silicon can be very finely ground in a ball triturotor lined with polyethylene and provided with agate balls without any danger of explosion and particularly without oxidation of the finely ground silicon particles which arise (oxidized silicon particles are disruptive for solar cell efficiency). For example, with a grinding run lasting several days, in the foregoing manner and without the danger of explosion and without oxidation, such a particle fineness can be attained that the resultant silicon powder easily attains a specific surface of $50m^2/g$ of material. This degree of fineness for silicon powder may be considered at the upper limit for the required fine grain size of silicon used to formulate the silicate slurry or slip to be sintered for particularly efficient silicon films for solar cells.

At the end of a grinding run, a non-oxygen-containing material, such as polyisobutylene or polyethylene, is added, along with compatible solvents, such as benzene, to the ground mass to attain a desired degree of viscosity in the resultant slip for drawing or extrusion of a silicon body therefrom. After extrusion, the silicon ribbon-like film can be divided into desired size pieces and then sintered in a manner known per se.

BRIEF DESCRIPTION OF THE DRAWINGS

The FIGURE is a schematic flow diagram of method steps occurring in accordance with the principles of the invention.

DESCRIPTION OF PREFERRED EMBODIMENTS

In accordance with the principles of the invention, a sintered silicon foil of particularly low porosity is produced by grinding silicon particles in an oxygen-free liquid to attain an average silicon rain size corresponding to a specific surface of at least about $50m^2/g$, thickening the resultant mass with a further oxygen-free material up to a viscosity adapted for drawing a film from the resultant viscous slip and thereafter, in a manner known per se drawing a film or sheet of silicon from such slip and sintering the same. If desired, the drawn film, before sintering, may be divided into smaller sized pieces.

In a preferred embodiment, the oxygen-free liquid utilized during grinding is decahydronaphthalene and the oxygen-free material utilized to thicken the ground particles is selected from the group consisting of polyisobutylene, polyethylene, and mixtures thereof in a compatible solvent.

In exemplary embodiment of the invention, 100g of silicon starting powder are admixed with 100g of decahydronaphthalene and, after grinding, 30g of a 10% solution of polyisobutylene (commercially available under the tradename Oppanol B50) is added, along with 4g of a solution comprised of polyethylene dissolved in benzene. This polyethylene solution is commercially available under the tradename Lupolen 1800.

As is apparent from the foregoing, particularly from the exemplarly embodiment, the additional outlay resulting from the use of oxygen-free grinding liquid is compensated as such in that directly after grinding and without intermediate drying or such, the preparation of the slip can be carried out. Also directly, the slip can be drawn out onto a suitable base, for example consisting of polyethylene terephthalate (commercially available under the tradename Hostafan), into a film or layer having a desired thickness, for example 150μm. Such slip drawing or extrusion takes place in the manner described in the earlier referenced Ser. No. 160,214 with the aid of a drawing shoe or tool for doctor blading, as is well known for drawing films, particularly in production of ceramic films. By slight heating, the solvent contained in the slip can be driven out to a large extent, more or less, and the silicon film obtained in this manner (still unsintered) can be removed from the base mentioned above. This silicon film has such a consistency that select bodies of predetermined dimension can be stamped out from the film. These stamped-out film portions can then be sintered on a specific plate, for example composed of aluminum oxide or silicon dioxide. As is known per se, the sintering of silicon film occurs with the exclusion of oxygen or, preferably, even in an argon atmosphere so that unallowable oxidation of silicon is avoided. During the sintering process, a heating occurs generally in the range of 1350° C. to below about 1430° C. and preferably at a temperature of about 1400° C. The shrinkage process which occurs during sintering leads, as a result of the very fine silicon particles in the film, to dense silicon layers having a very small amount of pores therein. For example, in instances where a film thickness of 150μm is first drawn from a slip, after sintering, such film has a thickness of about 100μm; which is particularly suitable for solar cells.

Further, during and after the addition of thickening materials (such as polyisobutylene and/or polyethylene) to the ground silicon in the grinding liquid to obtain the slip, this slip has such a consistency and such an amount of oxygen-free material that the finely ground silicon particles are so closely surrounded and coated with the oxygen-free materials that even during the drawing-out of a film, the subsequent heating and even during the sintering process, these minute silicon bodies are protected against oxidation.

The FIGURE schematically illustrates a flow diagram of method steps occurring in accordance with the principles of the invention. Reference numeral 1 indicates initial silicon material, which can already be reduced in size to a certain degree. Reference numeral 2 refers to an oxygen-free liquid, such as decahydronaphthalene. These materials are admixed and subjected to a grinding process at step 3. At step 4, the addition of non-oxygen-containing thickening material to the product obtained from the grinding process 3 occurs. This non-oxygen-containing material thickens the finely ground silicon powder into a relatively viscous slip. At step 6, the slip is drawn into a film and, optionally, separate or divided into a desired form. At step 7, sintering occurs. As indicated earlier, steps 6 and 7 occur in a manner which is known per se.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a method of producing films of sintered polycrystalline silicon whereby relatively fine silicon particles are worked-up with additives into a slip, which is drawn-out into a film and then sintered, the improvement comprising:

grinding initial silicon material in a non-oxygen-containing liquid to an average grain size corresponding to specific surface of at least $50 m^2/g$;

directly thickening the ground silicon particles and non-oxygen-containing liquid by adding a further non-oxygen-containing material so as to attain a viscosity in the resultant slip suitable for drawing a film from such slip; and in a manner known per se, drawing a film from such slip and sintering the resultant film.

2. In a method as defined in claim 1 wherein said non-oxygen-containing liquid is decahydronaphthalene.

3. In a method as defined in claim 1 wherein said non-oxygen-containing material is selected from the group consisting of polyisobutylene, polyethylene and mixtures thereof.

4. In a method as defined in claim 3 wherein said non-oxygen-containing is 10% solution of polyisobutylene.

5. In a method as defined in claim 3 wherein said non-oxygen-containing material is an admixture of a 10% solution of polyisobutylene and a solution of polyethylene in benzene.

* * * * *